US012446269B2

(12) United States Patent
Shih et al.

(10) Patent No.: US 12,446,269 B2
(45) Date of Patent: Oct. 14, 2025

(54) STRAINED NANOSHEETS ON SILICON-ON-INSULATOR SUBSTRATE

(71) Applicant: Taiwan Semiconductor Manufacturing Company, Ltd., Hsinchu (TW)

(72) Inventors: Ding-Kang Shih, New Taipei (TW); Chung-Liang Cheng, Changhua County (TW); Pang-Yen Tsai, Jhu-bei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 373 days.

(21) Appl. No.: 17/738,759

(22) Filed: May 6, 2022

(65) Prior Publication Data

US 2023/0031490 A1 Feb. 2, 2023

Related U.S. Application Data

(60) Provisional application No. 63/227,466, filed on Jul. 30, 2021.

(51) Int. Cl.
*H10D 30/69* (2025.01)
*H01L 21/02* (2006.01)
(Continued)

(52) U.S. Cl.
CPC ..... *H10D 30/798* (2025.01); *H01L 21/02532* (2013.01); *H01L 21/0259* (2013.01);
(Continued)

(58) Field of Classification Search
None
See application file for complete search history.

(56) References Cited

U.S. PATENT DOCUMENTS

| 7,015,116 B1 | 3/2006 | Lo et al. |
| 8,962,400 B2 | 2/2015 | Tsai et al. |
| (Continued) | | |

FOREIGN PATENT DOCUMENTS

| TW | 201248724 A | 12/2012 |
| TW | 201541638 A | 11/2015 |
| (Continued) | | |

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Richard A Booth
(74) *Attorney, Agent, or Firm* — Sterne, Kessler, Goldstein & Fox P.L.L.C.

(57) ABSTRACT

A strain-relaxed silicon/silicon germanium (Si/SiGe) bi-layer can be used as a foundation for constructing strained channel transistors in the form of nanosheet gate all-around field effect transistors (GAAFETs). The bi-layer can be formed using a modified silicon-on-insulator process. A superlattice can then be epitaxially grown on the bi-layer to provide either compressively strained SiGe channels for a p-type metal oxide semiconductor (PMOS) device, or tensile-strained silicon channels for an n-type metal oxide semiconductor (NMOS) device. Composition and strain of the bi-layer can influence performance of the strained channel devices.

20 Claims, 18 Drawing Sheets

(51) Int. Cl.
  *H10D 30/01* (2025.01)
  *H10D 30/67* (2025.01)
  *H10D 62/10* (2025.01)
  *H10D 86/00* (2025.01)
  *H10D 86/01* (2025.01)

(52) U.S. Cl.
  CPC ....... *H10D 30/031* (2025.01); *H10D 30/6735* (2025.01); *H10D 30/6757* (2025.01); *H10D 62/118* (2025.01); *H10D 86/01* (2025.01); *H10D 86/201* (2025.01)

(56) References Cited

U.S. PATENT DOCUMENTS

| | | |
|---|---|---|
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,553,031 B1 | 1/2017 | Besser et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 2005/0277271 A1* | 12/2005 | Beintner ............... H10D 64/015 257/E29.164 |
| 2012/0292639 A1 | 11/2012 | Liao et al. |
| 2015/0206965 A1 | 7/2015 | Cheng et al. |
| 2019/0051729 A1 | 2/2019 | Zhou |
| 2019/0067125 A1 | 2/2019 | Chiang et al. |
| 2019/0207015 A1 | 7/2019 | Mehandru et al. |
| 2020/0105750 A1 | 4/2020 | Xiao |
| 2020/0235133 A1 | 7/2020 | Xiao |
| 2021/0098302 A1 | 4/2021 | Ju et al. |
| 2021/0217752 A1 | 7/2021 | Fung |
| 2024/0047545 A1* | 2/2024 | Liao ................... H10D 84/0193 |
| 2024/0234530 A1* | 7/2024 | Tsai ................... H10D 30/6735 |

FOREIGN PATENT DOCUMENTS

| | | |
|---|---|---|
| TW | 201803027 A | 1/2018 |
| TW | 201826530 A | 7/2018 |
| TW | 201913821 A | 4/2019 |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

Cai et al., "Strain Relaxation and Threading Dislocation Density in Helium-implanted and Annealed Si1-x Gex / Si (100) Heterostructures," Journal of Applied Physics, vol. 95, p. 5347 (2004); 5 pages.

Powell et al., "New Approach to the Growth 1f Low Dislocation Relaxed SiGe Material," Electrochemical Society Transactions, vol. 64, No. 9, pp. 265-276 (2014); [Abstract]; 4 pages.

Scheuermann et al., "The Effect of SPA-SiO2 Tunnel Oxide Thickness for Metal-Insulator-Silicon Photoelectrochemical Cells," Electrochemical Society Transactions, vol. 64, No. 9, pp. 265-276 (2014); 12 pages.

Thompson et al., "A Logic Nanotechnology Featuring Strained-Silicon," IEEE Transactions on Electron Devices, vol. 25, pp. 191-193 (Apr. 2004); 3 pages.

Agrawal et al., "Gate-All-Around Strained Si0.4 Ge0.6 Nanosheet PMOS on Strain Relaxed Buffer for High Performance Low Power Logic Application," IEEE International Electron Devices meeting (2021); 4 pages.

* cited by examiner

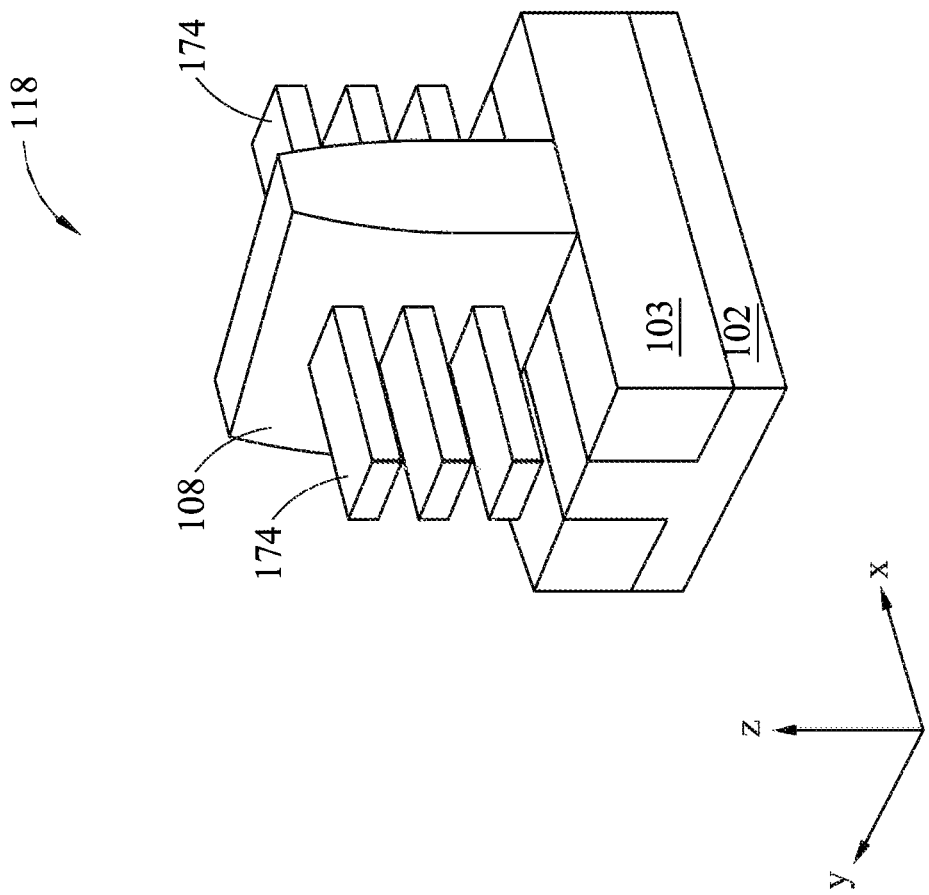
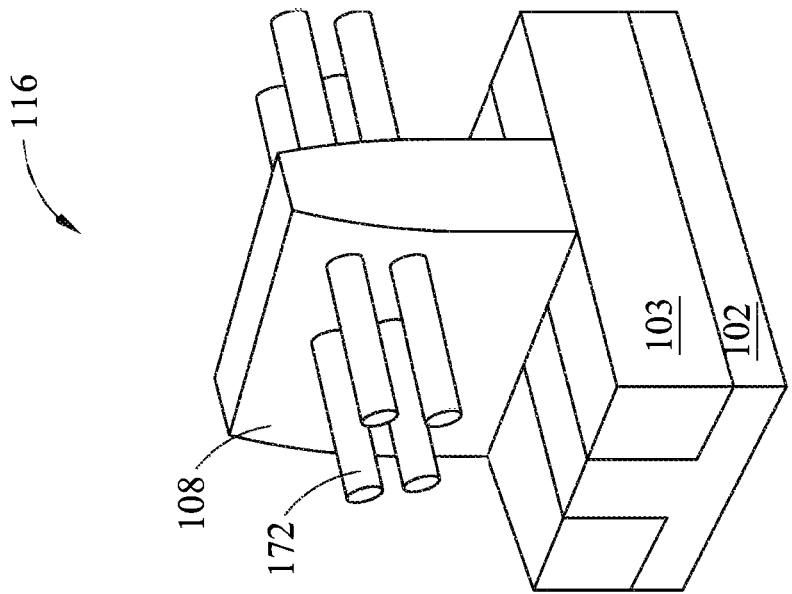
Fig. 1D
Fig. 1C

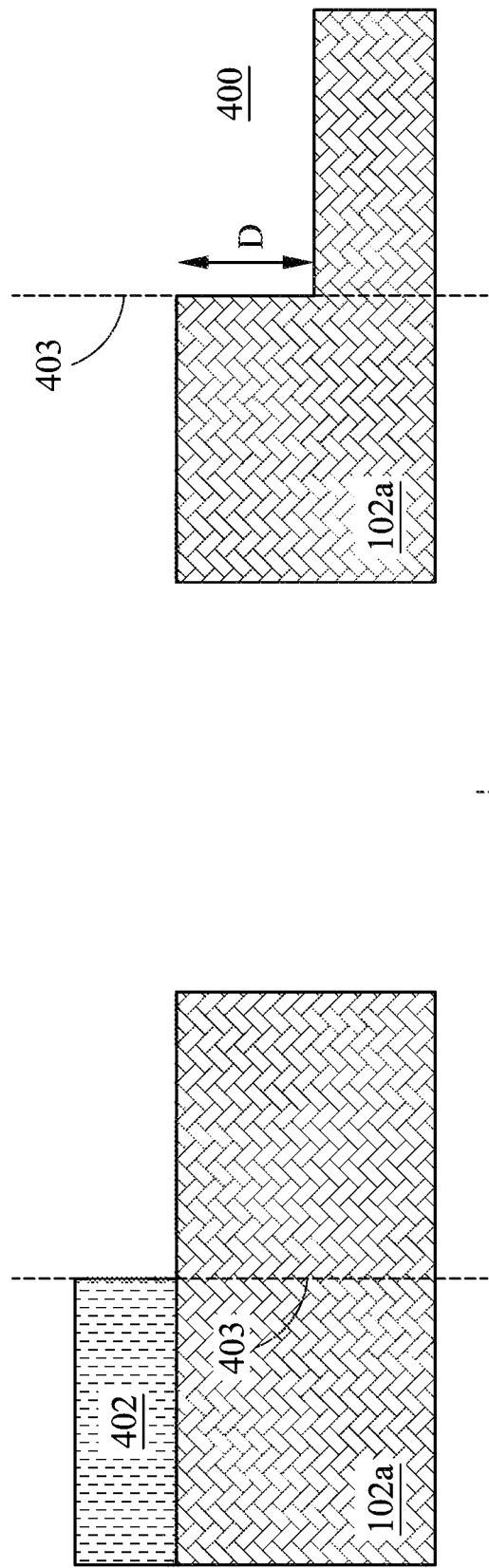
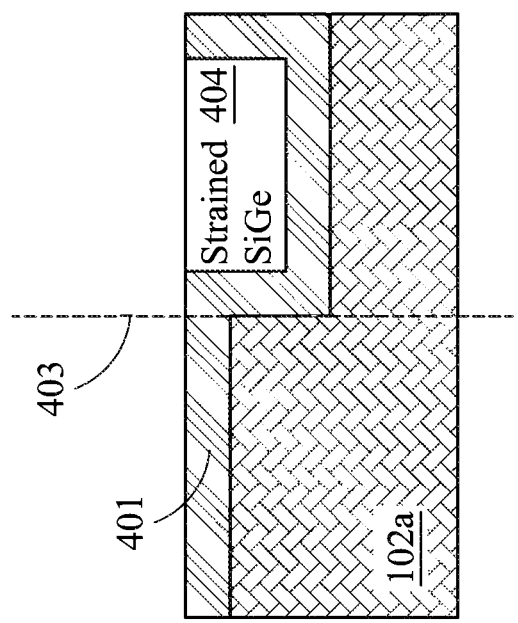
Fig. 4A
Fig. 4B
Fig. 4C

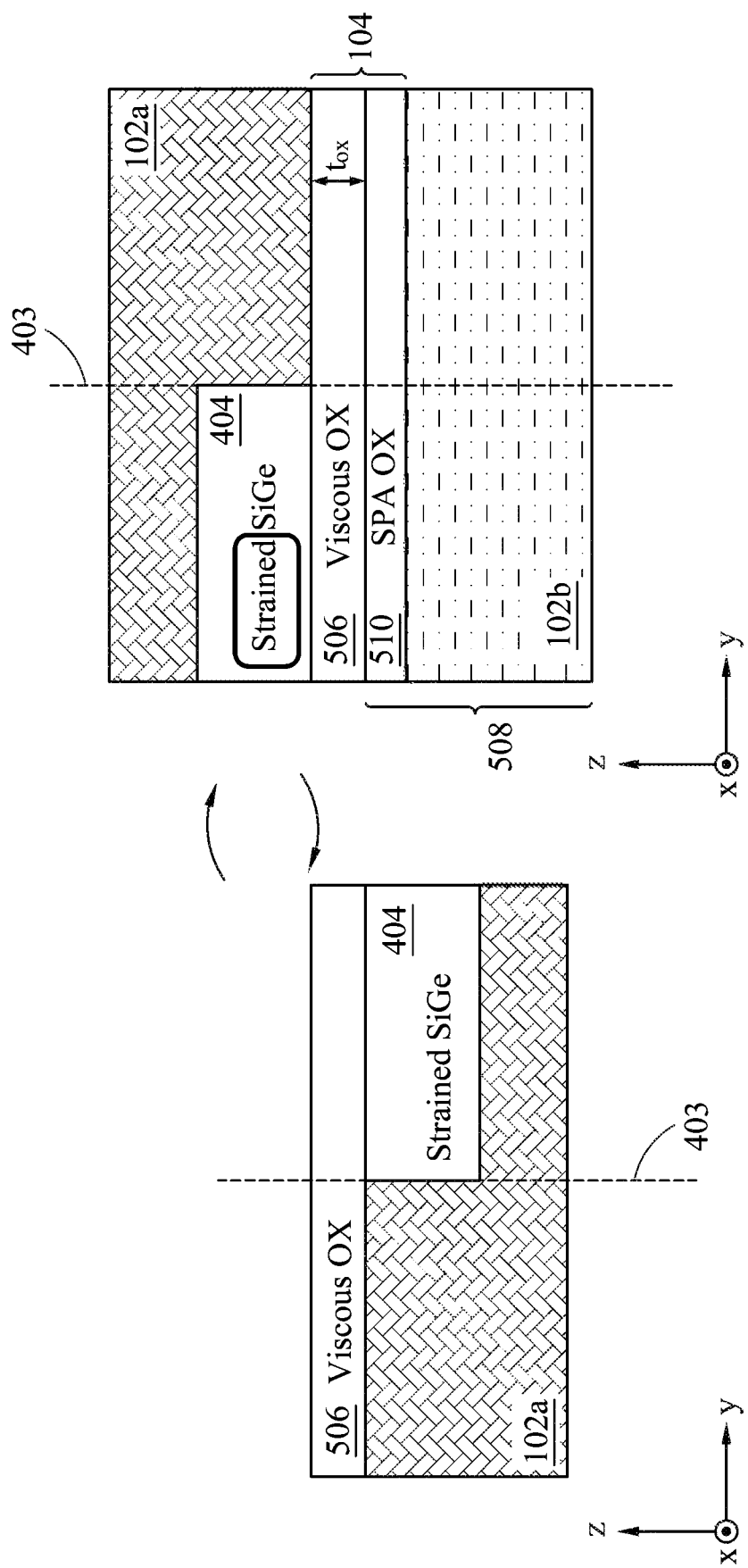

STRAINED NANOSHEETS ON SILICON-ON-INSULATOR SUBSTRATE

CROSS-REFERENCE TO RELATED APPLICATION

This patent application claims benefit of U.S. Provisional Patent Application No. 63/227,466 filed on Jul. 30, 2021 and titled "Fabrication of Strained Nanosheet CMOS Channels on SOI Substrates for Semiconductor Devices," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 1A-1D are isometric views of FinFET and gate-all-around (GAA) FET semiconductor devices, in accordance with some embodiments.

FIGS. 4A-4C and 5A-5E are cross-sectional views of the modified SOI structure shown in FIG. 2 at various stages of its fabrication process, in accordance with some embodiments.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The term "vertical," as used herein, means nominally perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Figure 1B:
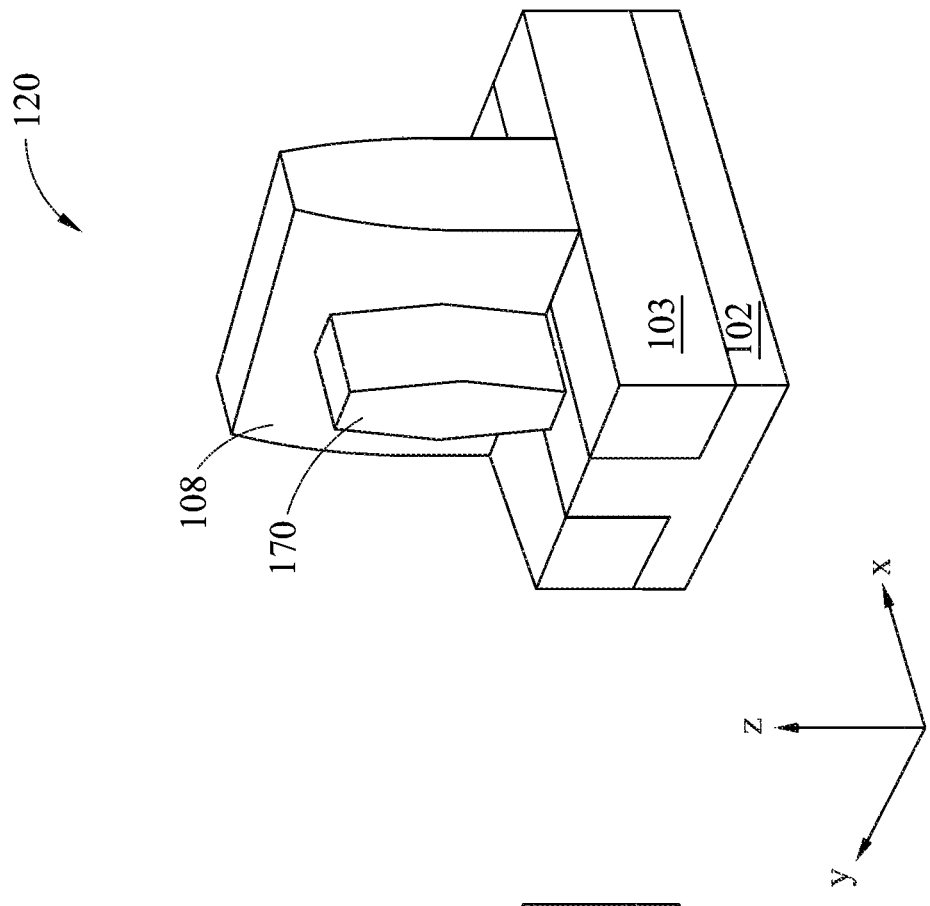
Figure 1A:
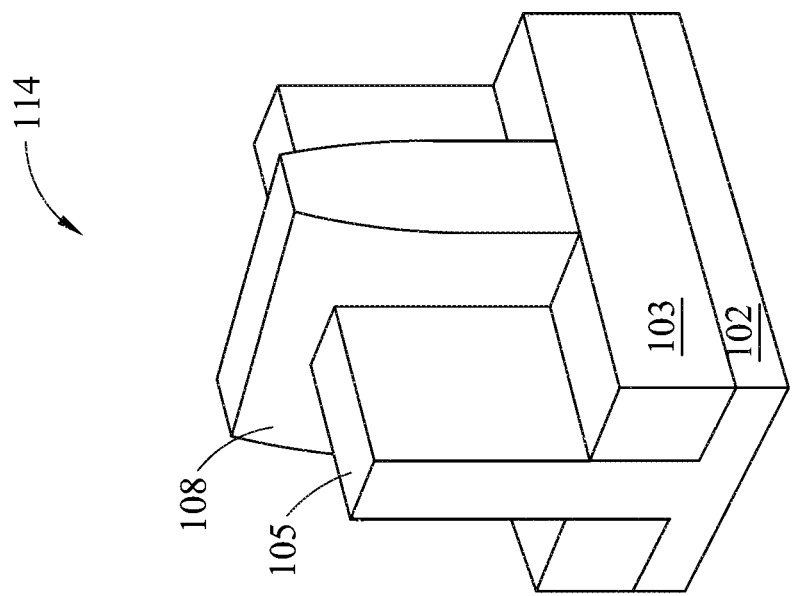

FIGS. 1A-1D illustrate different types of nanostructure FETs, in accordance with some embodiments. Nanostructure FETs include, for example, FinFETs, nanosheet transistors, nanowire transistors, gate-all-around FETs (GAAFETs), multi bridge channel transistors, and nano-ribbon transistors. FIG. 1A shows an isometric view of a FinFET 114 having source/drain regions 105 and a gate structure 108. FIGS. 1B-1D show similar isometric views of GAAFETs that are variations on the design of FinFET 114. GAAFETs having 1-D, linear channels, or nanowires 172 are referred to as nanowire FETs 116 (FIG. 1C); GAAFETs having 2-D channels, or nanosheets 174, are referred to as nanosheet FETs 118 (FIG. 1D). GAAFETs in which the fins have been recessed in the source/drain regions and replaced by epitaxial source/drain regions 170 are referred to as epi source/drain GAAFETs 120 (FIG. 1B). FinFETs 114 and GAAFETs 116, 118, and 120 are formed on a substrate 102, in which devices are separated from one another by isolation regions 103. Structures such as those shown in FIGS. 1A-1D may be formed on a common substrate 102, or on different substrates.

Embodiments of the present disclosure are shown and described, by way of example, as nanosheet FETs 118 (e.g., as shown in FIG. 1D) or epi source/drain GAAFETs 120 (e.g., as shown in FIG. 1B), where the nanosheet FETs 118 and epitaxial source/drain GAAFETs 120 feature strained channels. Strained channels as described herein may also be applied to other types of FETs—for example, FinFET 114

(e.g., as shown in FIG. 1A) or nanowire FETs 116 (e.g., as shown in FIG. 1C), or 2D planar FETs.

A method of fabricating transistors with strained SiGe channels and strained SiGe source/drain regions can rely on a substrate that has a SiGe strain-relaxed buffer (SRB) layer at the surface. Strained SiGe layers can then be grown epitaxially from the SRB. However, attributes of the SRB may degrade the channel quality and may limit the performance of the transistor. For example, the percentage of germanium in the SRB may restrict the channel strain. Also, the crystal quality of the SRB layer may degrade the channel quality. In addition, the SRB can be a thick epitaxially-grown layer, which may be expensive.

To avoid these drawbacks associated with an SRB layer, the SRB layer can be replaced by a partially-strained or a partially strain-relaxed Si/SiGe bi-layer 106 as a foundation for formation of strained channel transistors such as nanosheet FETs 118P and 118N. In some embodiments, the SRB layer can be replaced by a fully strain-relaxed Si/SiGe split bilayer 106. A strain-relaxed layer can be an initially strained lattice that has been altered by applying one or more strain relaxation techniques. In some embodiments, strain within the lattice structure of a film can be increased or decreased by changes in strain of surrounding materials.

Strained channel devices can increase carrier mobility in the channel, which increases switching speed, thereby improving device performance Once bi-layer 106 is formed, a nanosheet stack can be epitaxially grown on top of bi-layer 106 to provide either compressively strained SiGe channels for a PMOS device, e.g., nanosheet FET 118P, or tensile-strained silicon channels for an NMOS device, e.g., nanosheet FET 118N. In some embodiments, bi-layer 106 can be provided as a top layer of a modified silicon-on-insulator (SOI) structure.

Figure 2:
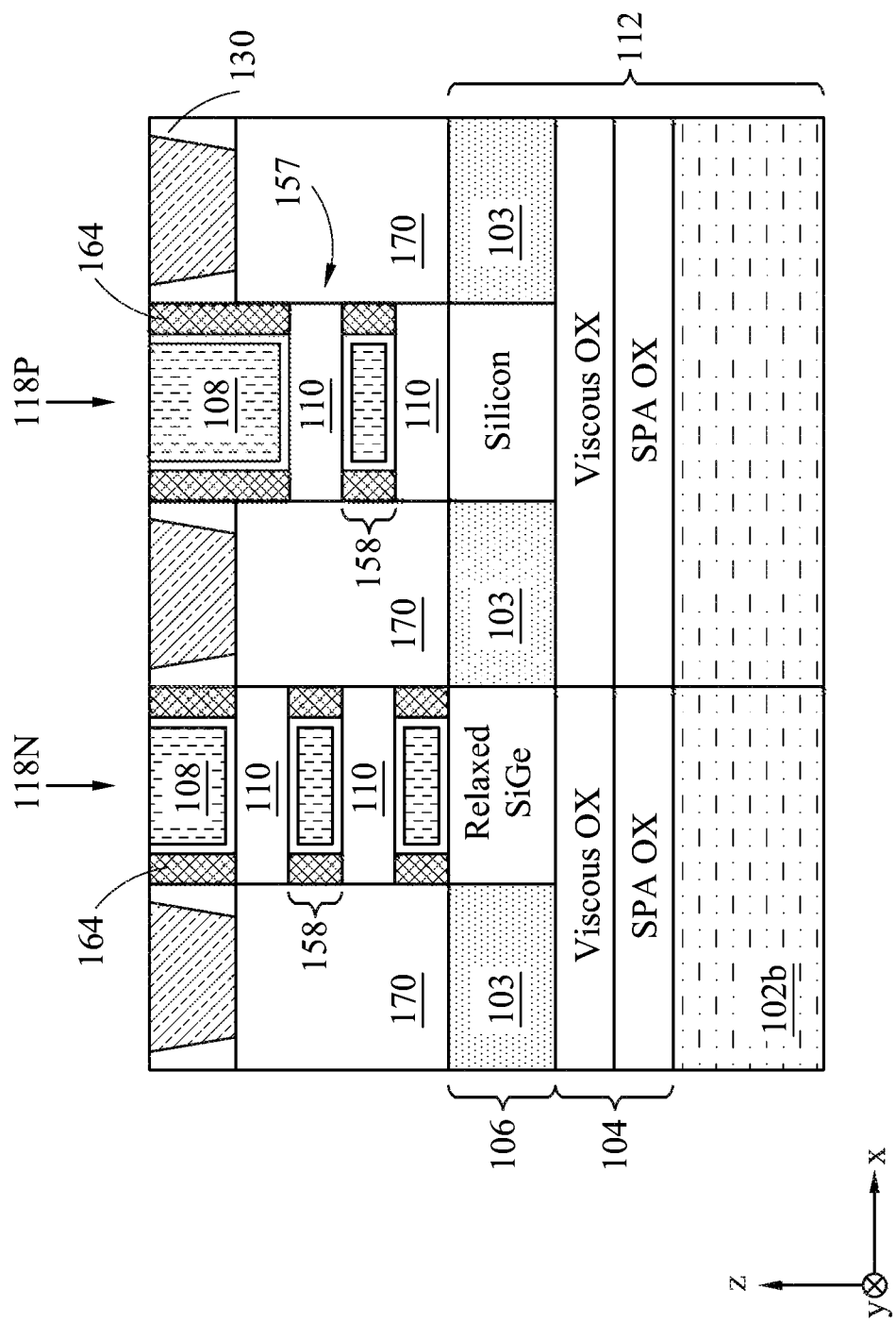
FIG. 2 is a cross-sectional view of PFET and NFET nanosheet transistors formed on a modified SOI structure, in accordance with some embodiments.

FIG. 2 shows a nanostructure FET in the form of a pair of exemplary PFET and NFET nanosheet FETs, 118P on the right side and 118N on the left side, respectively, of the type shown in FIG. 1D. Nanosheet FETs 118P and 118N shown in FIG. 2 are formed on a modified SOI structure 112 and feature nanostructure channels 110 that may include strained materials. In some embodiments, the term "nanostructure" may refer to dimensions less than about 100 nm. A structure, layer, and/or region can be described as "nanostructure" when it has a horizontal dimension (e.g., along an X- and/or Y-axis) and/or a vertical dimension (e.g., along a Z-axis) less than, for example, about 100 nm. Modified SOI structure 112 includes, as its top layer, bi-layer 106 in place of other silicon top layers. Bi-layer 106 is formed on top of a dual oxide layer 104, over a silicon substrate 102b. In some embodiments, nanosheet FETs 118P and 118N include epitaxial source and drain regions 170 and wrap-around gate structures 108/158. Wrap-around gate structures 108/158 are operable to maintain a capacitive applied voltage across multiple strained channels 110 to control currents therein. The use of strained channels 110 can increase carrier mobility and improve transistor performance Bi-layer 106 facilitates formation of various types of strained channels 110 within channel regions 157, as will be explained below. In some embodiments, channel 110 of PMOS device 118P is in contact with a silicon portion of bi-layer 106, while gate structure 158 of NMOS device 118N is in contact with a SiGe portion of bi-layer 106. In some embodiments, channel 110 of NMOS device 118N is in contact with a SiGe portion of bi-layer 106, while gate structure 158 of PMOS device 118P is in contact with a Si portion of bi-layer 106.

Figure 3:
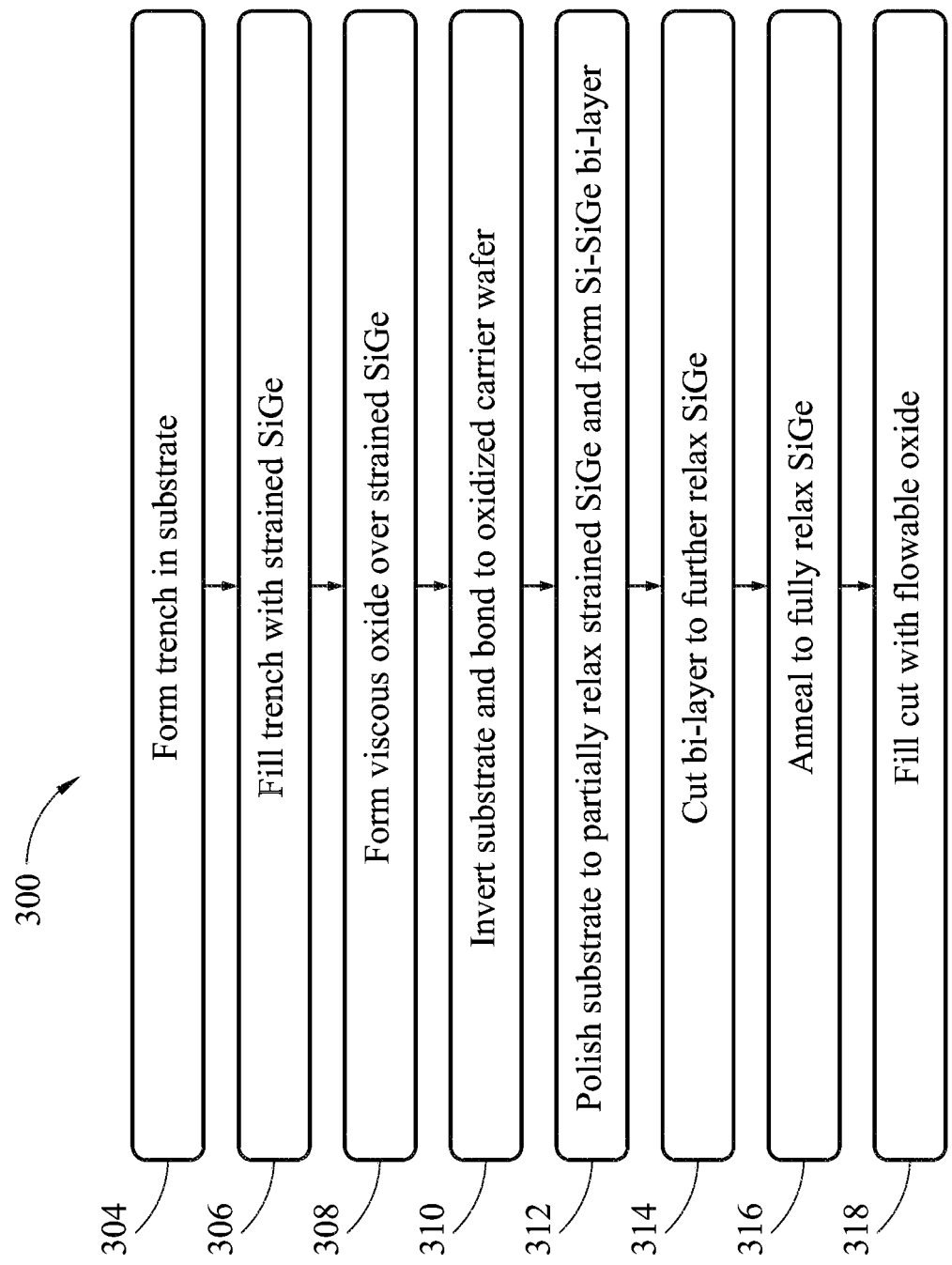
FIG. 3 is a flow diagram of a method for fabricating the modified SOI structure shown in FIG. 2, in accordance with some embodiments.

FIG. 3 shows operations in a method 300 of forming a modified SOI structure 112, with reference to FIGS. 4A-4C and 5A-5E, in accordance with some embodiments. Operations can be performed in a different order, or not performed, depending on specific applications. It is understood that additional processes can be provided before, during, or after method 300, and that some of these additional processes may only be briefly described herein.

Referring to FIG. 3, in operation 304, a trench 400 can be formed in substrate 102a as shown in FIGS. 4A-4B.

As used herein, the term "substrate" describes a material onto which subsequent material layers are added. The substrate itself may be patterned. Materials added on the substrate may be patterned or may remain unpatterned. Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface parallel to (100), (110), (111), or c-(0001) crystal plane. In some embodiments, substrate 102 can be made from an electrically non-conductive material, such as glass, sapphire, and plastic. Substrate 102 can be made of a semiconductor material such as silicon (Si). In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped with p-type dopants (e.g., boron (B), indium (In), aluminum (Al), or gallium (Ga)) or n-type dopants (e.g., phosphorous (P) or arsenic (As)). In some embodiments, different portions of substrate 102 can have opposite type dopants.

In some embodiments, trench 400 can be formed by blocking a portion of substrate 102a with a mask 402. In some embodiments, mask 402 is a photoresist mask that is spun onto substrate 102a, and exposed to light in a lithography stepper. Mask 402 can then be selectively removed in a development process so as to cover only a portion of substrate 102a, on one side of a boundary 403. Boundary 403 will later demarcate a PMOS region from an NMOS region. In some embodiments, boundary 403 may not represent an actual physical boundary. In some embodiments, mask 402 is a hard mask that can be patterned using a photolithography process followed by an etching process.

Once mask 402 is patterned, trench 400 can be formed by etching uncovered portions of substrate 102a to a recess depth D of about 10 nm to about 90 nm. The etching process for removing silicon from substrate 102a can be a dry etch process, a wet etch process, or a combination thereof. In some embodiments, the dry etch process can include using a plasma dry etch using a gas mixture that includes, for example, octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 500 mTorr. In some embodiments, the wet etch process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. Other gas species or chemicals suitable for the etching process are within the scope and spirit of this disclosure.

After trench 400 is formed, mask 402 can be removed by ashing at a high temperature, e.g., in a range of about 200 to about 500 degrees C. The ashing process can then be followed by a wet cleaning process to remove remnants of the mask material.

Referring to FIG. 3, in operation 306, trench 400 can be filled with a strained semiconductor material, e.g., compressively strained SiGe layer 404, as shown in FIG. 4C. In some embodiments, filling trench 400 can be accomplished by epitaxial growth of strained SiGe layer 404 in which the germanium composition may vary from about 20% to about 60%. The recess depth D of trench 400, as shown in FIG. 4B, can depend, in part, on the germanium concentration. For example, when the germanium concentration is about 25%, the corresponding recess depth D can be about 70 nm. In some embodiments, formation of strained SiGe layer 404 can be preceded by an optional preliminary SiGe layer 401 that can be conformally deposited over a top surface of substrate 102a and trench 400. In some embodiments, preliminary SiGe layer 401 can have a smaller germanium concentration than SiGe layer 404. In some embodiments, preliminary SiGe layer 401 can have either a fixed germanium concentration or a graded germanium concentration.

When formed by an epitaxial growth process, strained SiGe layer 404 aligns with silicon atoms at a lower interface of strained SiGe layer 404 and substrate 102a. Overgrowth of strained SiGe layer 404 beyond a top surface of strained SiGe layer 404 may be removed by a chemical mechanical planarization (CMP) process. In some embodiments, the CMP process used to planarize strained SiGe layer 404 can partially relax the strain within as-grown SiGe layer 404.

Figure 5C:
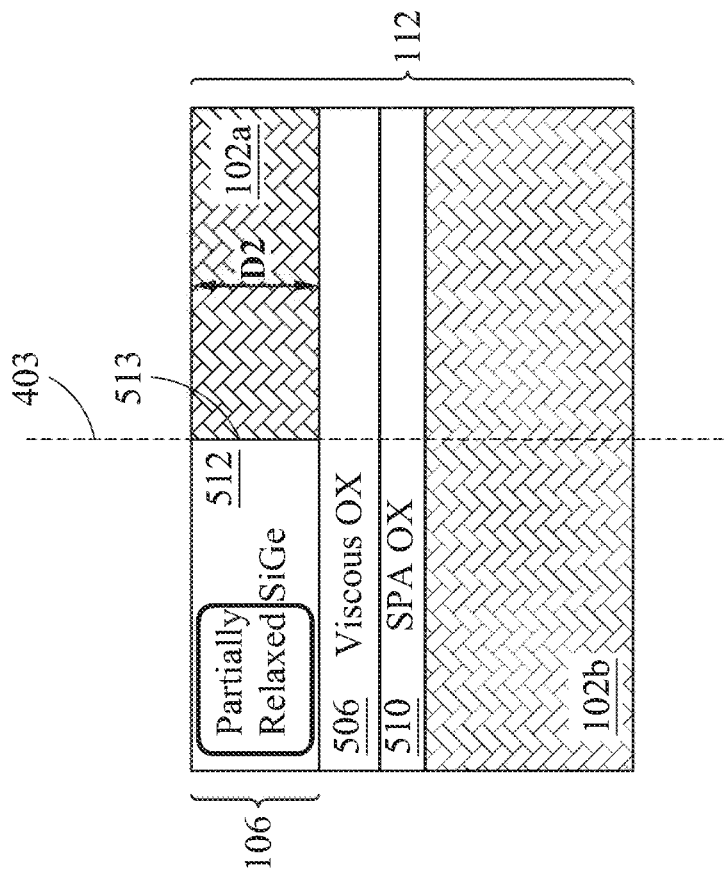

Referring to FIG. 3 and FIGS. 5A-5D, in operation 308, a first oxide layer 506 can be grown on substrate 102, over strained SiGe layer 404, as shown in FIG. 5A. A thickness $t_{ox}$ of first oxide layer 506 can be in a range of about 30 nm to about 500 nm. In some embodiments, first oxide layer 506 is a thermal oxide. In some embodiments, first oxide layer 506 is a viscous, electrically insulating layer. The term "viscous" as used herein refers to a material having a high viscosity, or thickness between a solid and a liquid, where the high viscosity provides flexibility, while remaining resistant to deformation. First oxide layer 506 can include one or more films having viscous or elastic characteristics, for example, boron-phosphorosilicate glass (BPSG), flowable CVD oxide, amorphous oxide, silicon carbon nitride (SiCN), or silicon oxy-carbon nitride (SiOCN). In some embodiments, first oxide layer 506 can include a single film or multiple films having viscous or elastic deformation characteristics, such as viscous nitride, $Si_3N_4$ and hexagonal boron nitride (h-BN).

Referring to FIG. 3, in operation 310, silicon substrate 102a can be inverted and bonded to a carrier wafer 508, indicated by cyclic arrows between FIG. 5A and FIG. 5B. Carrier wafer 508 includes a substrate 102b, similar to substrate 102a, and a second oxide layer 510 on substrate 102b. In some embodiments, second oxide layer 510 is an ultra-thin film, having a thickness in a range of about 2 nm to about 3 nm. Oxide layer 510 can be grown at low temperature, e.g. below 400° C., in a plasma that is ionized by a slot-plane antenna (SPA). Following operation 310, first oxide layer 506 is in contact with oxide layer 510 so as to form dual oxide layer 104. It is advantageous for first oxide layer 506 to have good adhesion properties, to facilitate bonding with oxide layer 510.

Referring to FIG. 3, in operation 312, silicon substrate 102a is thinned to form bilayer 106, as shown in FIG. 5C. Silicon substrate 102a can be made co-planar with strained SiGe layer 404 by polishing using a CMP process. The CMP process used to thin substrate 102a can partially relax strain within strained SiGe layer 404, creating partially relaxed SiGe 512 as shown in FIG. 5C. Relaxation may be enhanced when first oxide layer 506 is a viscous oxide. A viscous first oxide layer 506 serves as a flexible, "pseudo substrate" alternative to a rigid silicon substrate supporting bi-layer 106. Such a viscous layer is solid at room temperature, but, upon annealing above a transition temperature, begins to reflow with lateral expansion, thus encouraging similar lateral expansion of partially relaxed SiGe 512 as well.

However, relaxed SiGe 512 may not be fully relaxed due to residual strain at a vertical interface 513 between relaxed SiGe 512 and substrate 102a. Following operation 312, partially relaxed SiGe 512 has thickness D2, approximately the same as strained SiGe layer 404 prior to thinning substrate 102a. That is, the thickness D2 of the partially relaxed SiGe material is not substantially reduced during operation 312, according to some embodiments. If partially relaxed SiGe 512 is too thin, it may not survive polish operation 312; if partially relaxed SiGe 512 is too thick, its influence on epitaxial growth of a subsequent film may be diminished.

Figure 5D:
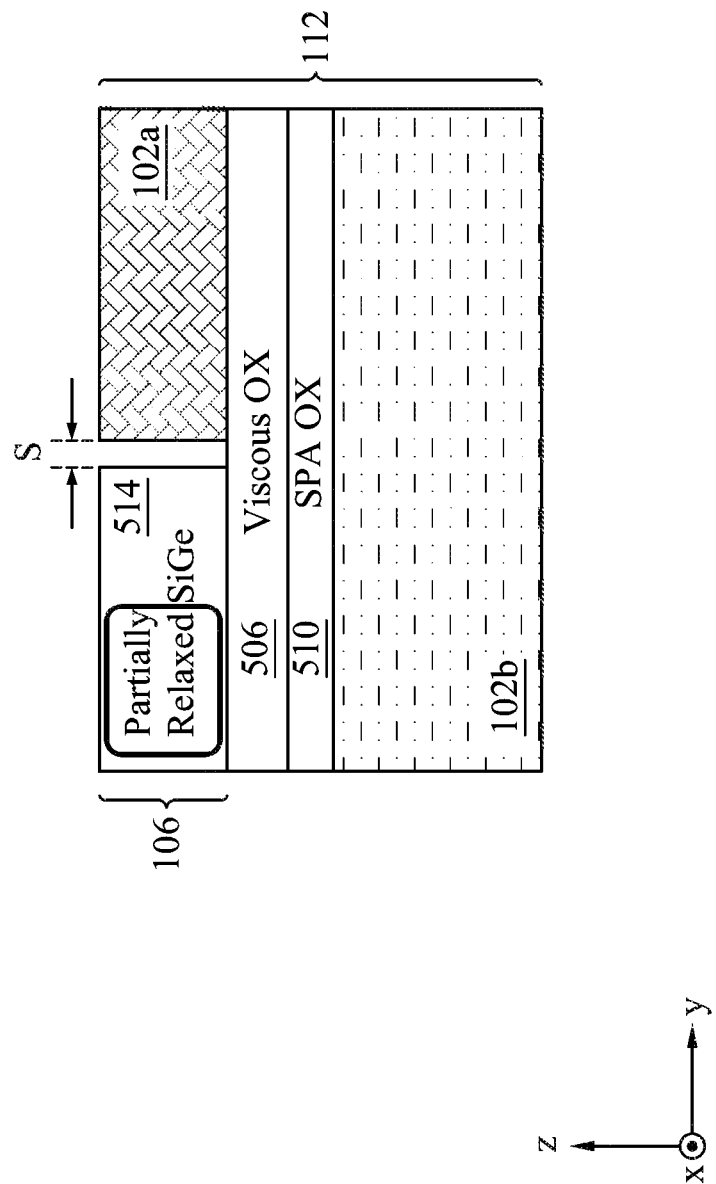

Referring to FIG. 3, in operation 314, bi-layer 106 can be cut as illustrated in FIG. 5D. Introducing a separation S between the two halves of bi-layer 106 provides further strain relaxation. In some embodiments, forming a boundary cut along axis 403 can be accomplished using a second photolithography process sequence to pattern bi-layer 106 using a photoresist mask. A narrow cut, where the separation S is in a range of about 4.8 nm to about 5.2 nm, can be formed in a photolithography mask and transferred to bi-layer 106 by a plasma etch process using, for example, Cl, Br, or a fluorine-based etchant species. Following operation 314, split bi-layer 106 contains partially relaxed SiGe 514, which is more relaxed than partially relaxed SiGe 512, but still may not be fully relaxed.

Referring to FIG. 3, in operation 316, bi-layer 106 can be annealed to transform partially relaxed SiGe 514 into fully relaxed SiGe 516. In some embodiments, the annealing temperature can be in a range of about 100° C.-1050° C., and the anneal can occur in an ambient gas containing $N_2$, $H_2$, Ar, He, or a mixture of $H_2$ and $N_2$. When a viscous oxide, e.g., first oxide layer 506 underlying bi-layer 106, is heated during operation 316, the viscous oxide material reflows to a final thickness in a range of about 100 nm to about 200 nm. Plastic deformation of the viscous oxide during reflow induces lateral expansion in the adjacent SiGe layer, further relieving compressive strain in partially relaxed SiGe 514. Because the SiGe portion of bi-layer 106 is no longer constrained by surrounding materials, bi-layer 106, as illustrated in FIG. 5D, contains fully relaxed SiGe 516.

Figure 5E:
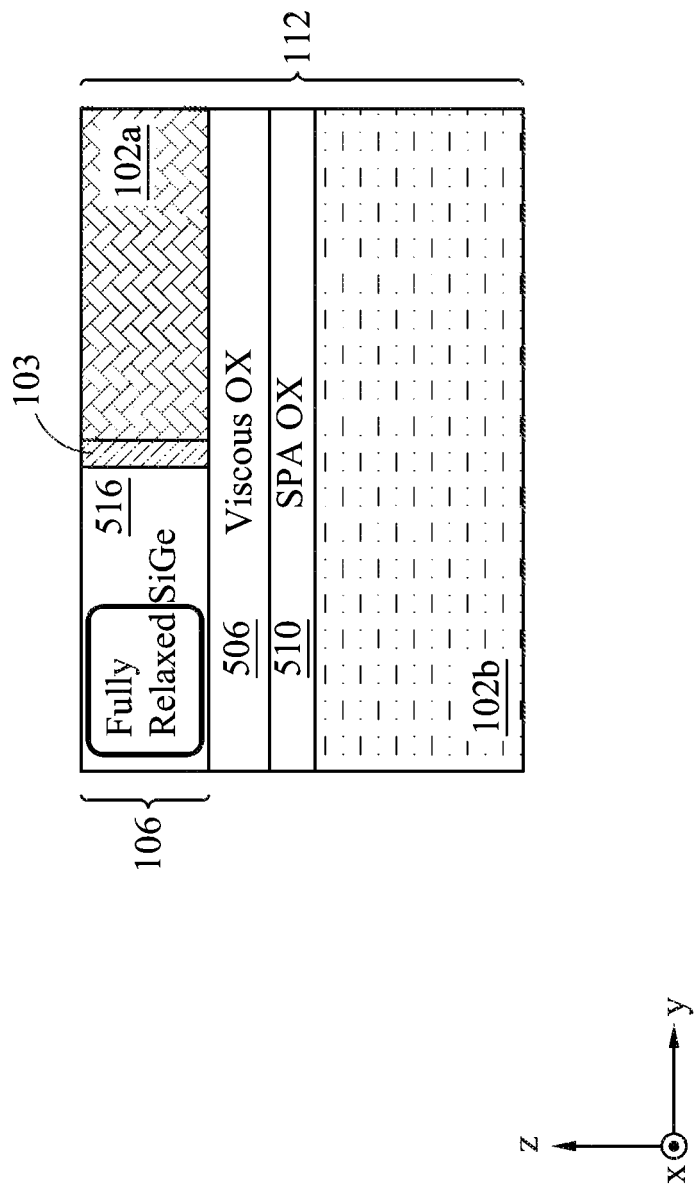

Referring to FIG. 3, in operation 318, separation S can be filled with an insulating material, e.g., flowable oxide, to create an isolation region 103 between the two portions of bi-layer 106 as shown in FIG. 5E. The flowable oxide can be deposited over bi-layer 106 to fill separation S between fully relaxed SiGe 516 and silicon substrate 102a. Additional flowable oxide that is deposited on top of bi-layer 106 can then be removed using, for example, an isotropic etching process e.g., wet etch, or a CMP process that is selective to both SiGe and silicon portions of bi-layer 106. In some embodiments, a thickness of flowable oxide for removal from the surface of bi-layer 106 can be in a range of about 4 nm to about 6 nm.

A strain-free bi-layer 106, together with dual oxide layer 104 and substrate 102b, make up modified SOI structure 112. One advantage of modified SOI structure 112 is that high quality epitaxial films suitable for use in optoelectronics devices can be grown on top of fully relaxed SiGe 516. Another advantage of using modified SOI structure 112 instead of a thick SRB is that the modified SOI structure permits use of a wider variety of germanium concentrations in the SiGe films.

Figure 6:
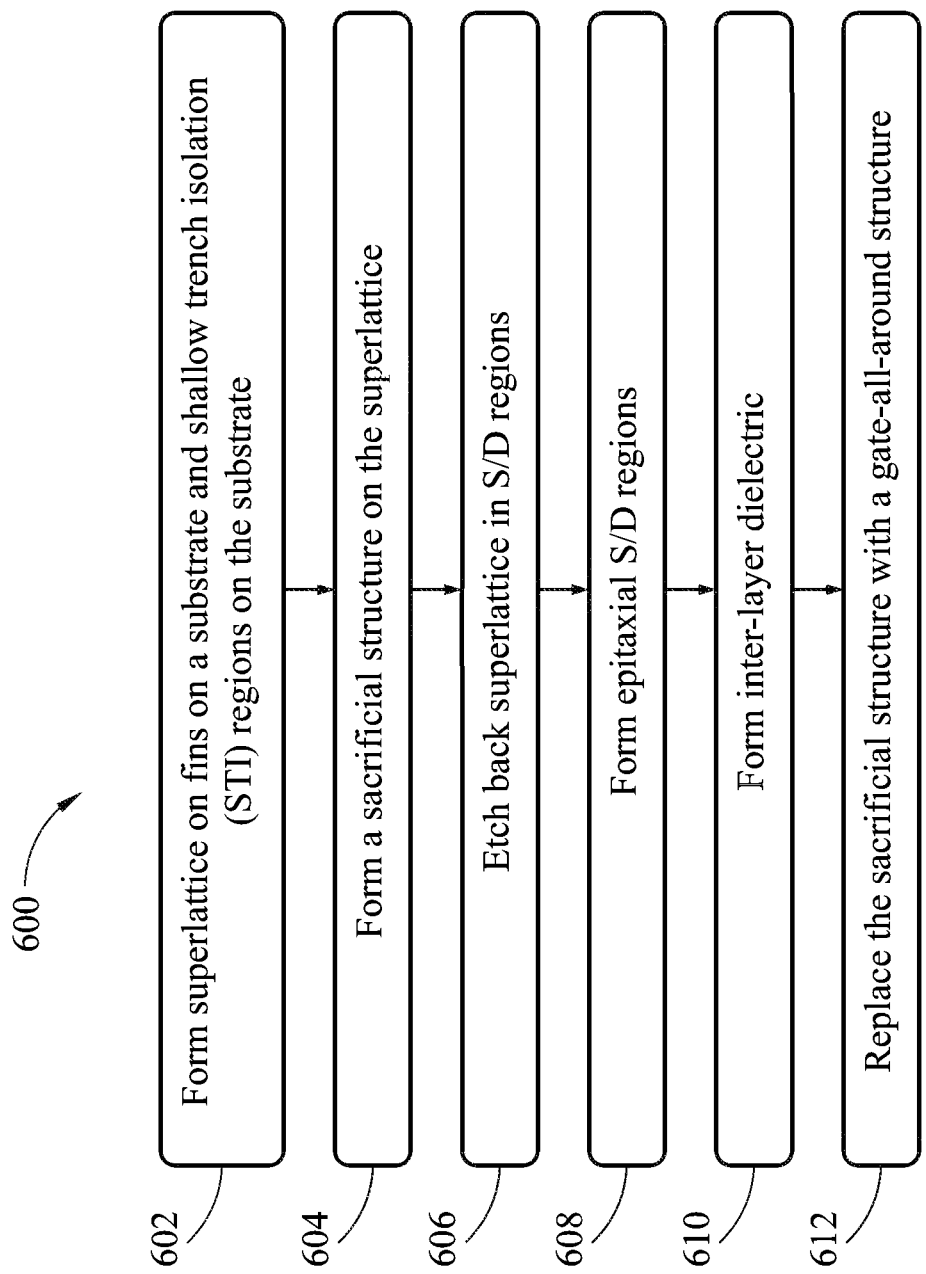
FIG. 6 is a flow diagram of a method for fabricating nanosheet transistors on a modified SOI structure, in accordance with some embodiments.

FIG. 6 shows operations in a method 600 of forming nanostructure FETs 118P and 118N on modified SOI structure 112, with reference to FIGS. 7-14, in accordance with some embodiments. Operations can be performed in a different order, or not performed, depending on specific applications. It is noted that method 600 may not produce complete nanosheet FETs 118P and 118N. Accordingly, it is understood that additional processes can be provided before, during, or after method 600, and that some of these additional processes may only be briefly described herein.

Figure 7:
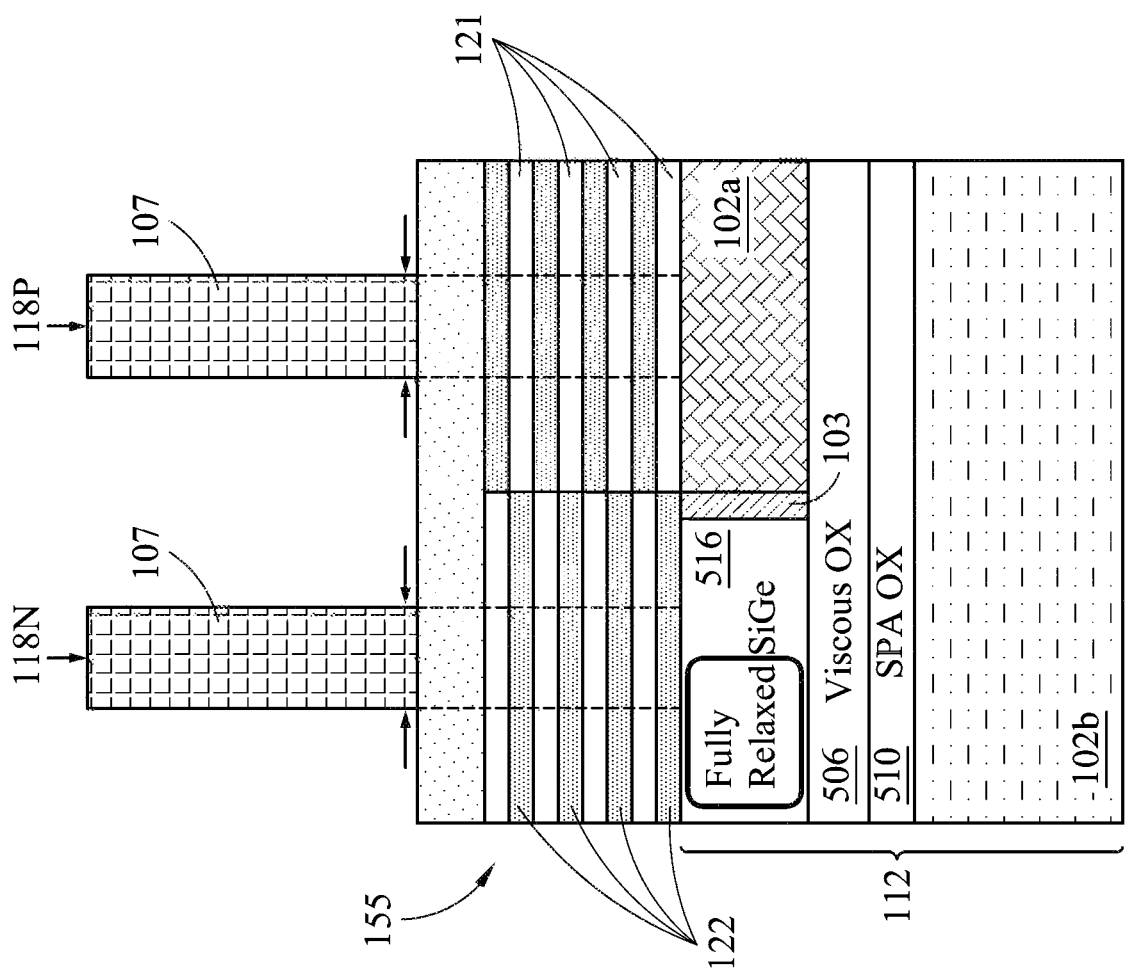
FIGS. 7 and 13A-13E are cross-sectional views of nanosheet FETs at various stages of their fabrication process, in accordance with some embodiments.

Referring to FIG. 6, in operation 602, a superlattice 155 can be formed on modified SOI structure 112, as shown in FIG. 7. In some embodiments, superlattice 155 is in the form of a multilayer nanosheet stack. Superlattice 155 can include a stack of nanostructure layers 121 and 122 arranged in an alternating configuration. In some embodiments, nanostructure channel layers 121 include materials similar to one another, e.g., epitaxial Si, and nanostructure sacrificial layers 122 include materials similar to one another, e.g., epitaxial SiGe. In some embodiments, NMOS structures alternate nanostructure layers so that sacrificial layers 122 are in contact with modified SOI structure 112, while PMOS structures alternate nanostructure layers so that channel layers 121 are in contact with modified SOI structure 112. In some embodiments, superlattice 155 is formed by etching a stack of two different semiconductor layers arranged in the alternating configuration. Nanostructure sacrificial layers 122 are replaced in subsequent processing, while nanostructure channel layers 121 remain as part of nanosheet FETs 118P and 118N. Although FIG. 6 shows four nanostructure channel layers 121 and four nanostructure sacrificial layers 122, any number of nanostructure layers can be included in each superlattice 155. The alternating configuration of superlattice 155 can be achieved by alternating deposition, or epitaxial growth, of SiGe and Si layers, starting from bi-layer 106. Si layers can form nanostructure channel layers 121, which are interleaved with SiGe nanostructure layers 122. Each of the nanostructure layers 121-122 may have thicknesses in a range of about 1 nm to about 5 nm. In some embodiments, the topmost nanostructure layers (e.g., Si layers) of superlattice 155 may be thicker than the underlying nanostructure layers.

Superlattice 155 can be formed via an epitaxial growth process. The epitaxial growth process can include a combination of deposition operations and epitaxial growth operations, such as (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or another suitable CVD process; (ii) molecular beam epitaxy (MBE) processes (iii) another suitable epitaxial process; or (iv) a combination thereof. In some embodiments, superlattice 155 can be grown by an epitaxial deposition/partial etch process, which repeats the epitaxial deposition/partial etch process at least once. Such repeated deposition/partial etch process is also called a "cyclic deposition-etch (CDE) process." In some embodiments, layers of superlattice 155 can be grown by selective epitaxial growth (SEG), where an etching gas can be added to promote selective growth on exposed semiconductor surfaces, but not on insulating material.

In some embodiments, epitaxial growth can involve one or more silicon or SiGe precursor gases, such as silane ($SiH_4$), di-silane ($Si_2H_6$), germane ($GeH_4$), and di-germane ($Ge_2H_6$). Doping of superlattice 155 can also be determined by introducing one or more precursors during the above-noted epitaxial growth process. For example, superlattice 155 can be in-situ p-type doped during the epitaxial growth process using p-type doping precursors, such as diborane ($B_2H_6$) and boron trifluoride ($BF_3$). In some embodiments, the stack of two different semiconductor layers can be in-situ n-type doped during an epitaxial growth process using n-type doping precursors, such as phosphine ($PH_3$) and arsine ($AsH_3$).

Figure 11:
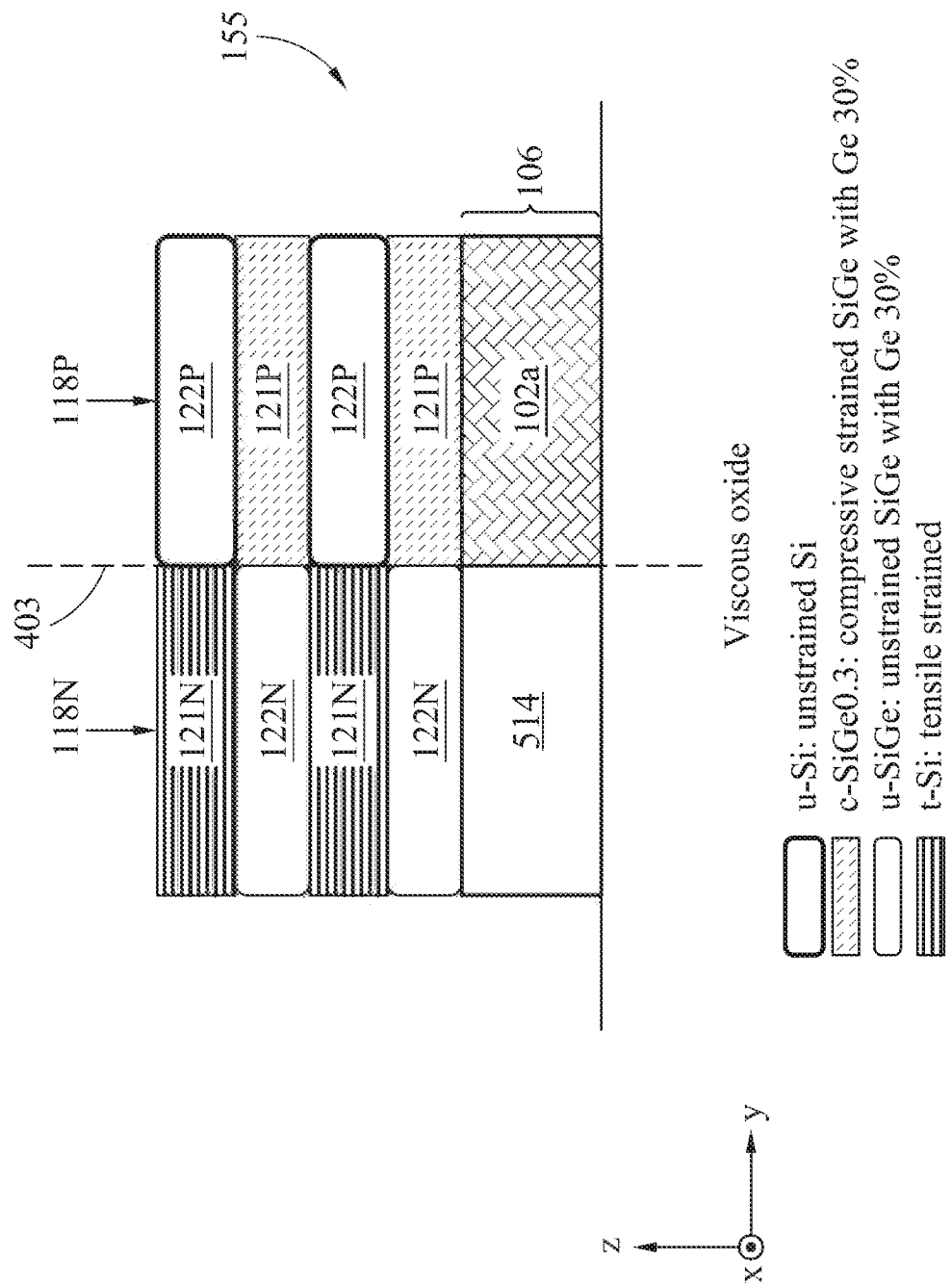
Figure 12:
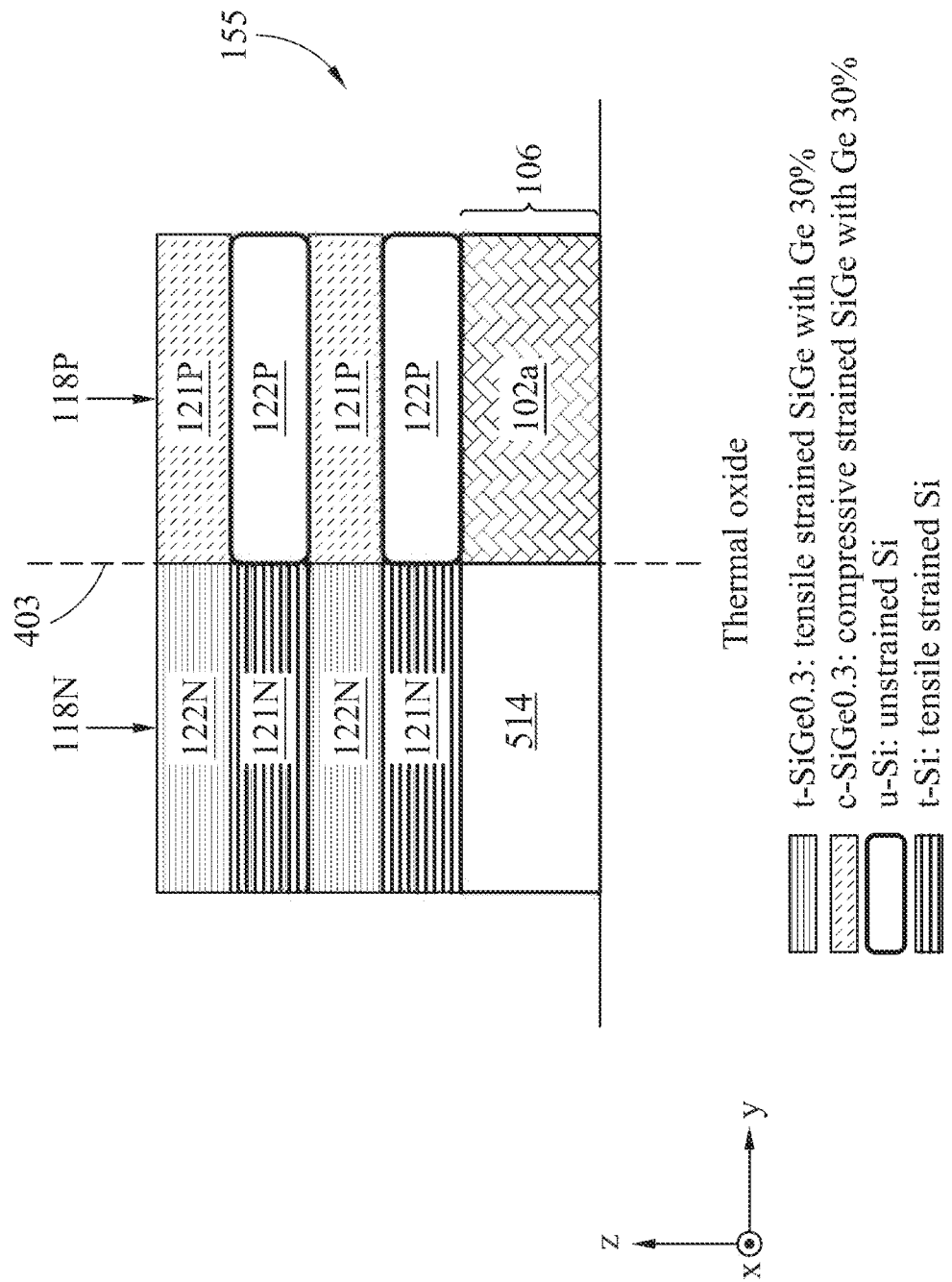
Figure 13C:
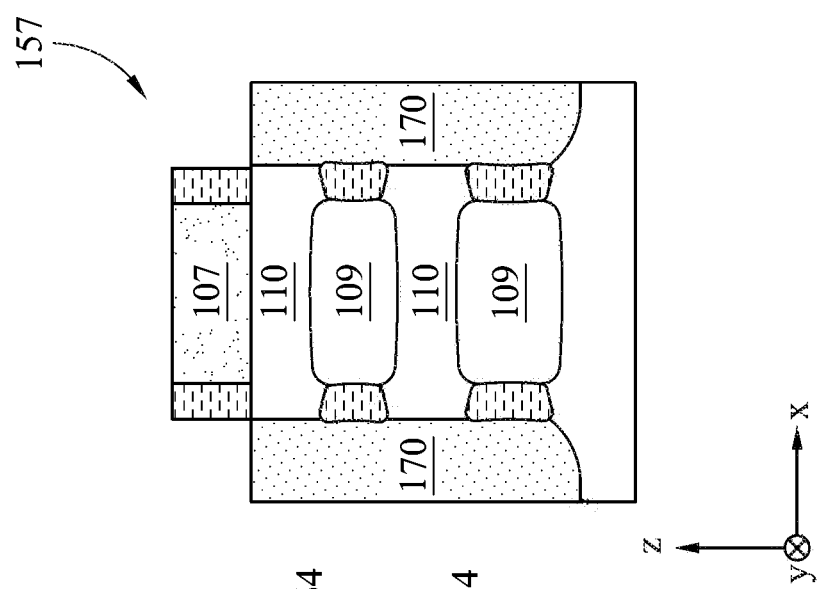
Figure 13B:
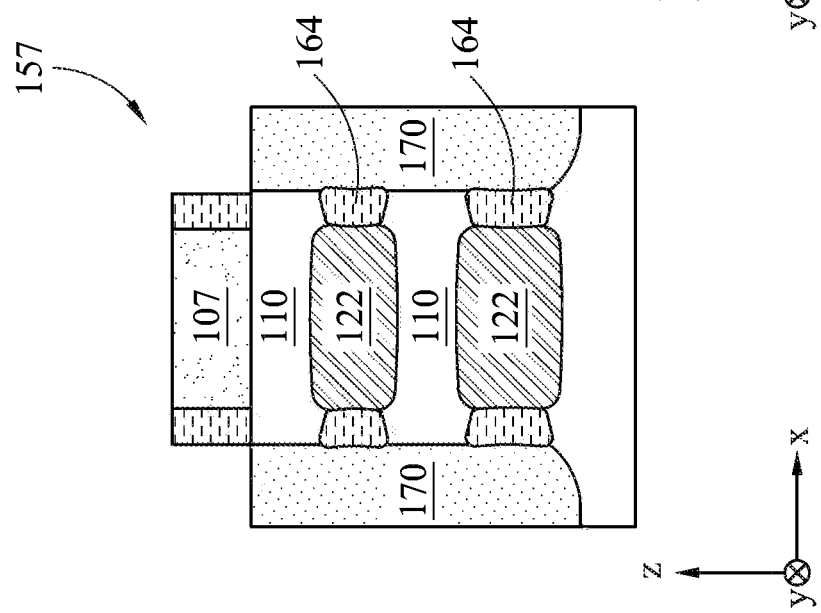
Figure 13A:
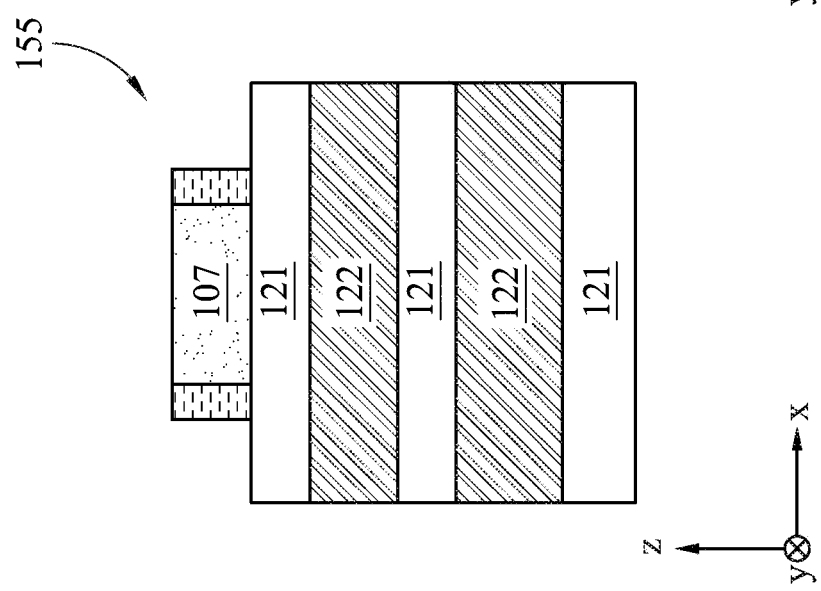
Figure 13E:
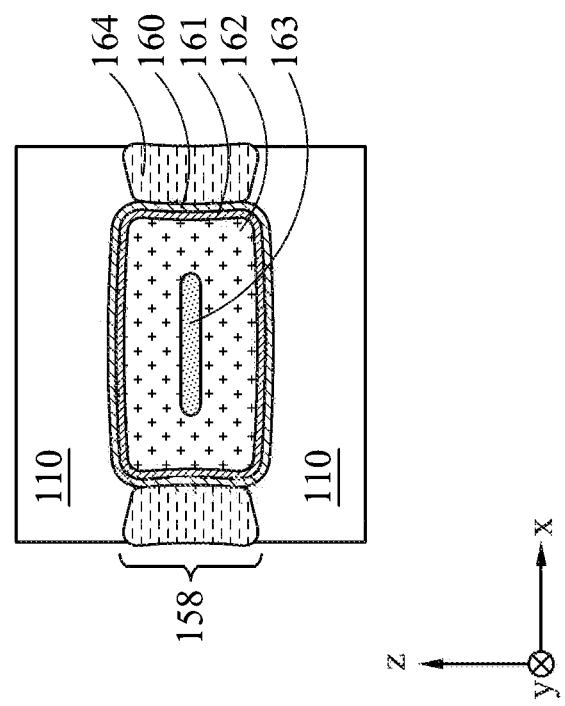
Figure 13D:
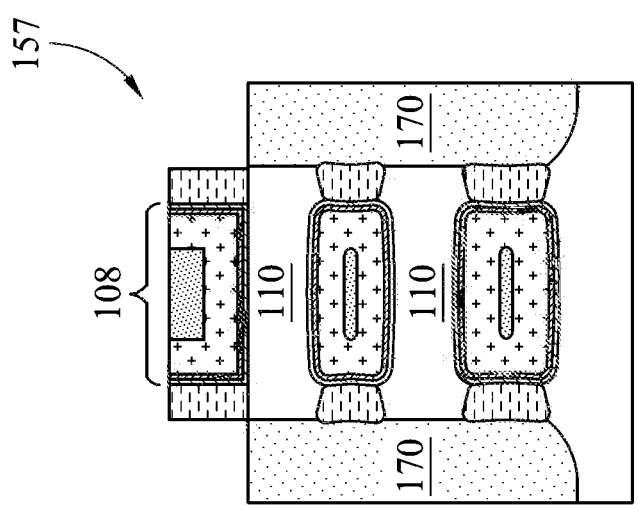

FIGS. 8-12 show five examples of superlattice 155 in which strained materials are formed as stacked channel layers 121, as shown in FIG. 7 and FIG. 13A. Nanostructure channel layers 121 will then form strained channels 110 as shown in the magnified views of FIGS. 13B-13E, while nanostructure sacrificial layers 122 will be removed and replaced with GAA structures 158 as shown in FIGS. 13D-13E.

In the examples presented in FIGS. 8-12, alternating layers of superlattice 155 for PMOS devices are epitaxially grown from the silicon portion of bi-layer 106, that is, on inverted substrate 102a. Meanwhile, alternating layers of superlattice 155 for NMOS devices are epitaxially grown from the strain-relaxed SiGe portion of bi-layer 106, e.g., on fully relaxed SiGe 516, in which different examples can have different germanium concentrations. Process temperatures during epitaxial growth can be below a transition temperature of viscous oxide to avoid reflowing first oxide layer 506 again. In some embodiments, epitaxial growth process is selective to SiGe or selective to Si. Epitaxial films will not grow on STI 103 separating the SiGe and silicon portions of bi-layer 106.

In the NMOS devices, the germanium content of fully relaxed SiGe 516 influences the strain of the subsequently formed layer. For example, when the germanium content of fully relaxed SiGe 516 is about 30%, if the next layer formed in contact with fully relaxed SiGe 516 has a germanium content of about 60%, it will be a compressive-strained SiGe layer. This is because SiGe with 30% germanium has a smaller lattice constant than SiGe with 60% germanium. Therefore, as the larger lattice elastically accommodates to the underlying smaller lattice at the interface during coherent growth of atomic layers, the film with the larger lattice is subject to compressive strain. Conversely, when a film having a smaller lattice constant is formed on a film having a larger lattice constant the film being formed will be subject to tensile strain. When the next layer formed in contact with silicon 102a is SiGe with 60% germanium, the SiGe grows coherently on the silicon with a similar lattice constant, and is therefore not under strain. Strain and/or composition of NMOS channel layers 121 can, in turn, be influenced by adjacent NMOS sacrificial layers 122 during the epitaxial growth process. As an underlying film causes tensile or compressive strain in an epitaxially grown film, the epitaxially grown film may, in turn, influence strain on a third film that is deposited on the epitaxially grown film.

Figure 8:
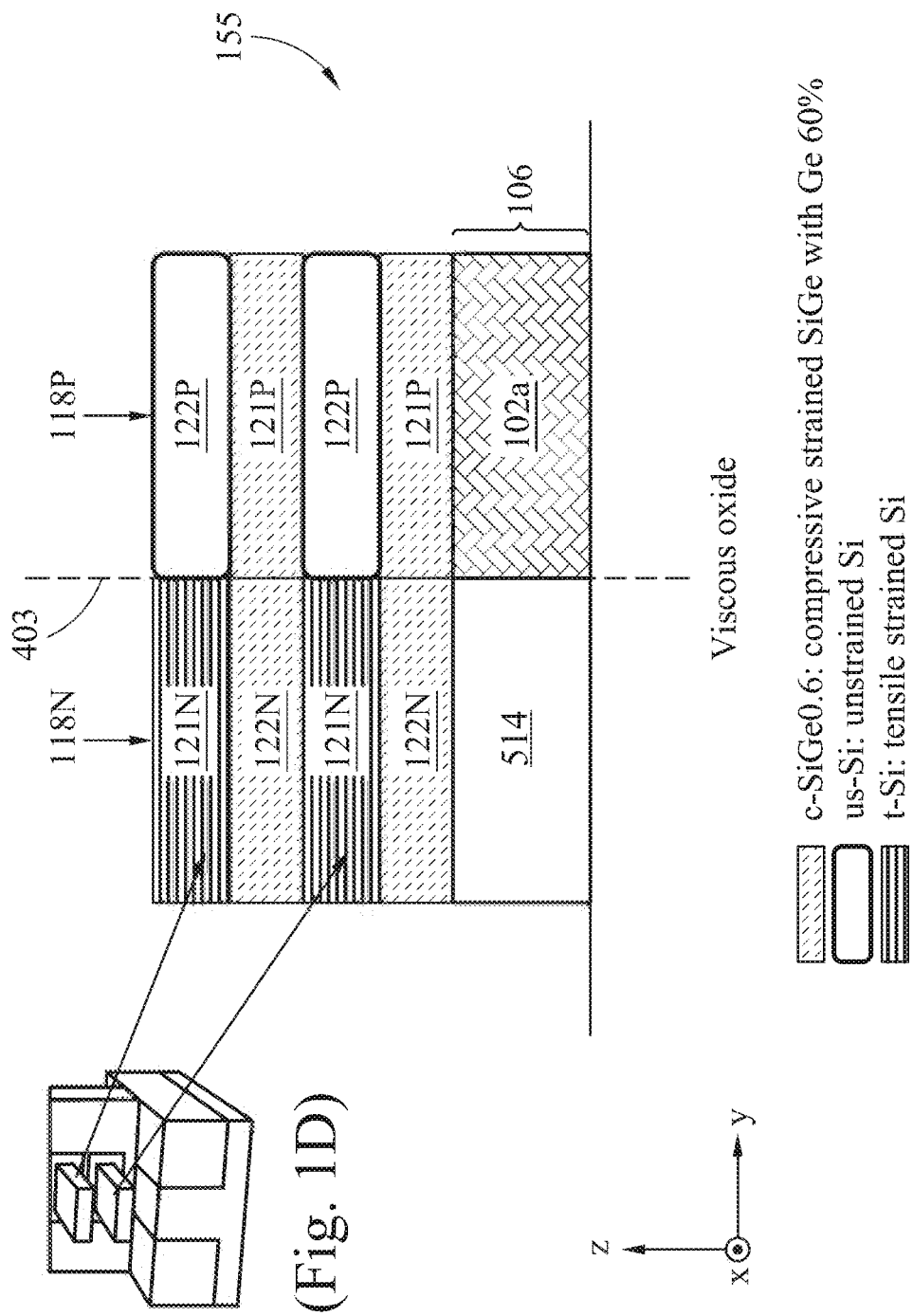
FIGS. 8-12 are cross-sectional views of various embodiments of stacked nanosheets with strained channels as shown in FIG. 7 and FIG. 13A, in accordance with some embodiments.

Referring to FIG. 8, in a first example, superlattice 155 for the PMOS nanosheet FET 118P is formed by alternating epitaxial growth of nanostructure layers 121P and 122P, starting with nanostructure channel layers 121P in contact with substrate 102a of bi-layer 106. In some embodiments, each one of the PMOS nanostructure channel layers 121P can be made of compressive strained SiGe having about 60% germanium content, with a thickness in a range of about 3 nm to about 10 nm. In some embodiments, each one of the nanostructure sacrificial layers 122P can be made of unstrained silicon with a thickness in a range of about 6 nm to about 30 nm.

In the first example shown in FIG. 8, superlattice 155 for the NMOS nanosheet FET 118N is formed by alternating nanostructure layers 121N and 122N, starting with nanostructure sacrificial layers 122N in contact with relaxed SiGe 514 having about 30% germanium content. For the NMOS device, nanostructure channel layers 121N are made of tensile strained silicon, and nanostructure sacrificial layers 122N are made of compressive strained SiGe having about 60% germanium content.

Figure 9:
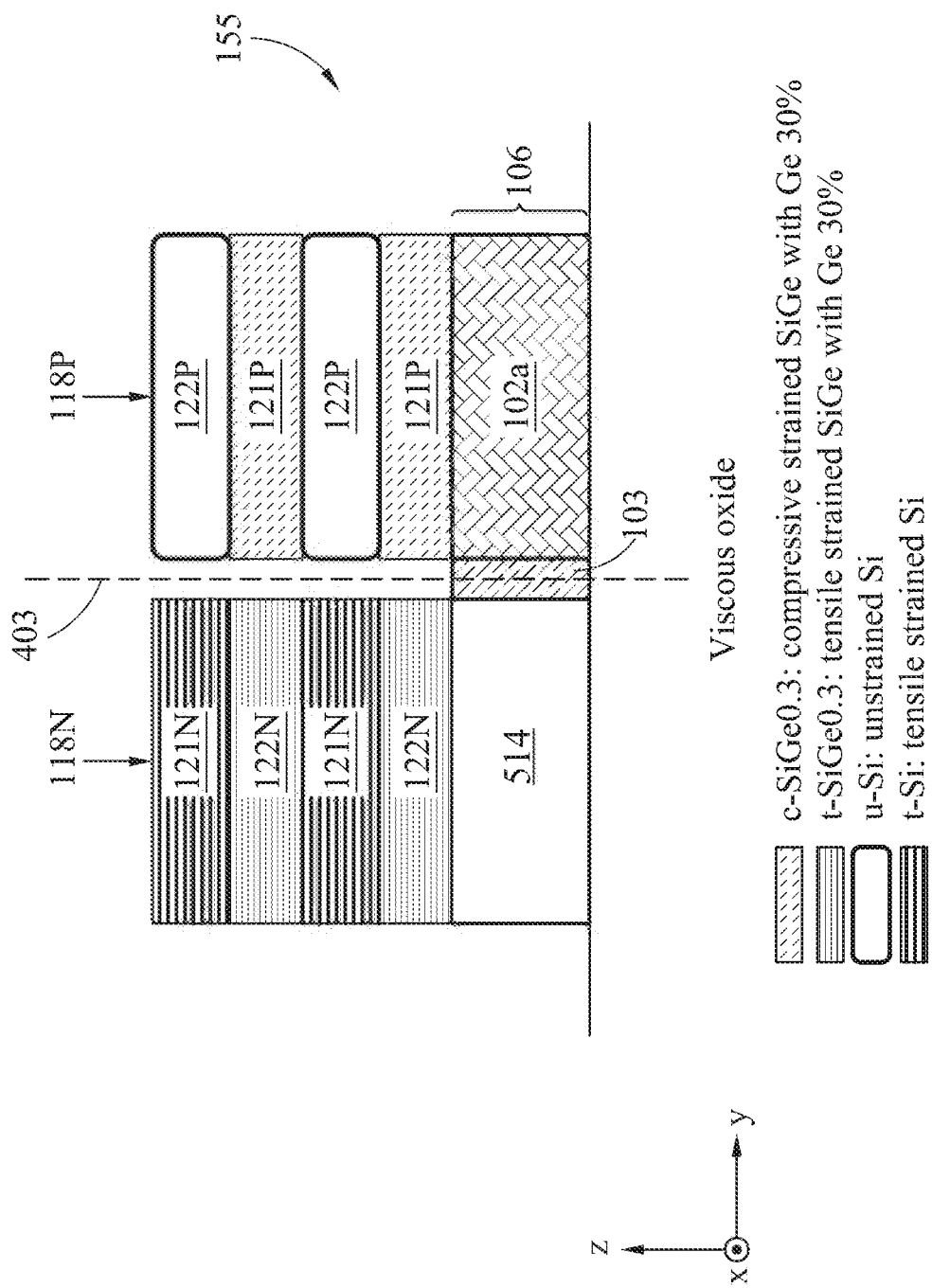

Referring to FIG. 9, in a second example, superlattice 155 for the PMOS nanosheet FET 118P is the same as in FIG. 7 except that nanostructure channel layers 121P are made of compressive strained SiGe having about 30% germanium content. Superlattice 155 for the NMOS nanosheet FET 118N is formed by alternating nanostructure layers 121N and 122N, starting with nanostructure sacrificial layers 122N in contact with relaxed SiGe 514 having about 60% germanium content. For the NMOS device, nanostructure channel layers 121N are made of tensile strained silicon, and nanostructure sacrificial layers 122N are made of tensile-strained SiGe having about 30% germanium content.

Figure 10:
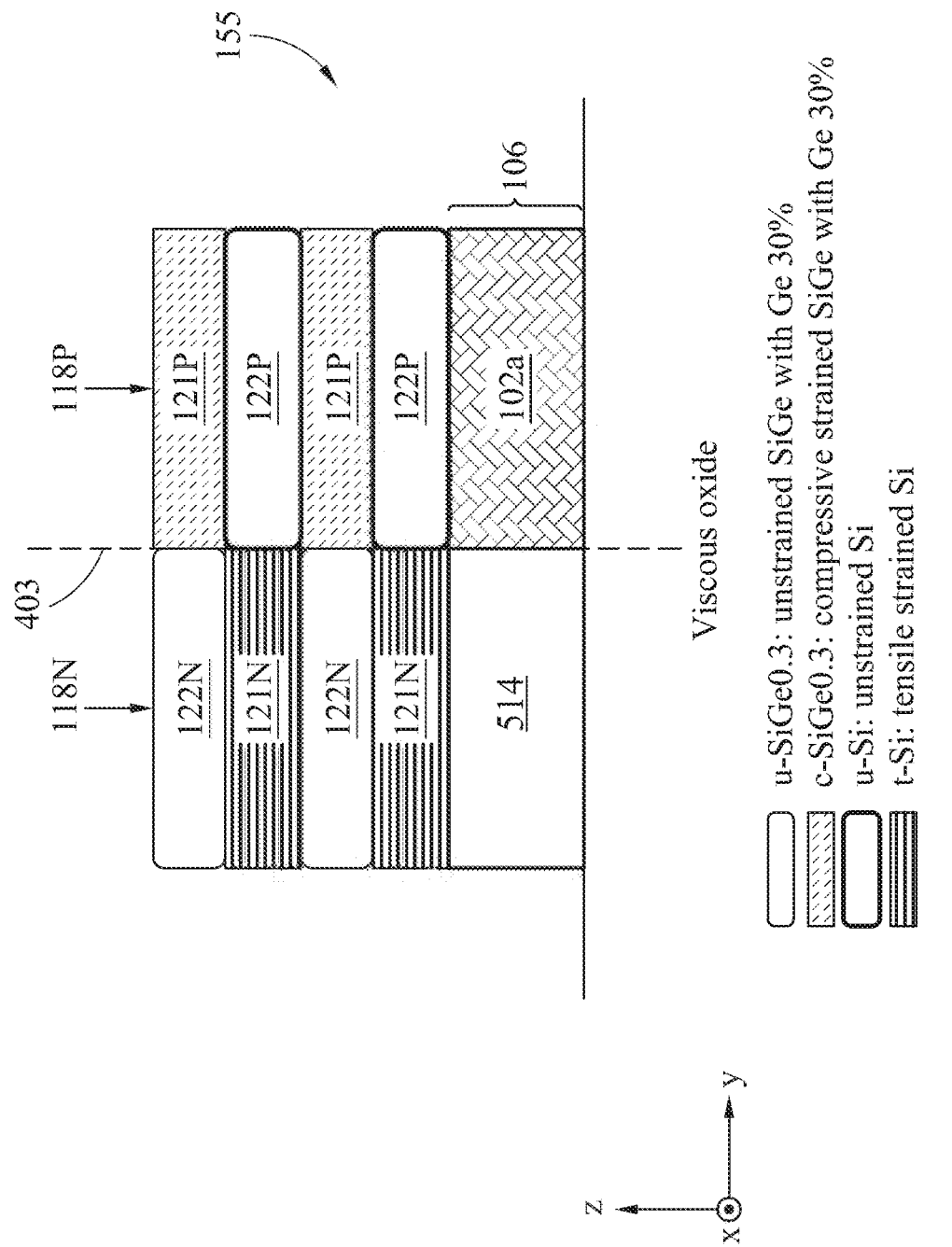

Referring to FIG. 10, in a third example, superlattice 155 for the PMOS nanosheet FET 118P is formed by alternating nanostructure layers 121P and 122P, starting with nanostructure sacrificial layers 122P in contact with substrate 102a of bi-layer 106. For the PMOS device, nanostructure channel layers 121P are made of compressive strained SiGe having about 30% germanium content, and nanostructure sacrificial layers 122P are made of unstrained silicon.

In the third example shown in FIG. 10, superlattice 155 for the NMOS nanosheet FET 118N is formed by alternating nanostructure layers 121N and 122N, starting with nanostructure channel layers 121N in contact with relaxed SiGe 514 having about 30% germanium content. For the NMOS device, nanostructure channel layers 121N are made of tensile strained silicon, and nanostructure sacrificial layers 122N are made of unstrained SiGe having about 30% germanium content.

Referring to FIG. 11, in a fourth example, superlattice 155 for the PMOS nanosheet FET 118P is the same as in FIG. 8. Superlattice 155 for the NMOS nanosheet FET 118N is formed by alternating nanostructure layers 121N and 122N, starting with nanostructure sacrificial layers 122N in contact with relaxed SiGe 514 having about 30% germanium content. For the NMOS device, nanostructure channel layers 121N are made of tensile strained silicon, and nanostructure sacrificial layers 122N are made of unstrained SiGe having about 30% germanium content.

Referring to FIG. 12, in a fifth example, superlattice 155 for the PMOS nanosheet FET 118P is the same as in FIG. 9. Superlattice 155 for the NMOS nanosheet FET 118N is formed by alternating nanostructure layers 121N and 122N, starting with nanostructure channel layers 121N in contact with relaxed SiGe 514 having about 60% germanium content. For the NMOS device, nanostructure channel layers 121N are made of tensile strained silicon, and nanostructure sacrificial layers 122N are made of tensile strained SiGe having about 30% germanium content.

It is noted that in the five examples above of superlattice 155, nanostructure sacrificial layers 122P are made of unstrained silicon and nanostructure channel layers 121N are made of tensile strained silicon. Also, whenever the first layer formed in the PMOS device is a channel layer 121P, the corresponding layer of the NMOS device is a sacrificial layer 122N.

Referring again to FIG. 6, following formation of superlattice 155, in operation 604, a sacrificial gate structure 107 can be formed on superlattice 155, as shown in FIGS. 7 and 13A. Sacrificial gate structure 107 can include a polysilicon gate structure 108 having sidewall spacers 128. Polysilicon gate structure 108 can be deposited and then patterned using a hard mask, e.g., an oxide material that can be grown and/or deposited using an ALD process. Sacrificial gate structure 107 will later be replaced by a metal gate-all-around (GAA) structure 158.

Referring to FIG. 6, in operation 606, superlattice 155 can be recessed in source/drain regions, as shown in FIGS. 7 and 13B, using any suitable etching process as described above. Following the source/drain recess process, layers of superlattice 155 remain in a channel region 157 underneath sacrificial gate structure 107 as shown in FIG. 13B.

Referring to FIG. 6, in operation 608, epitaxial source/drain regions 170 can be formed, as shown in FIGS. 2 and 13B-13D. Epitaxial source/drain regions 170 can be doped in-situ or ex-situ with boron, phosphorous, arsenic, or other suitable dopants to create NFET or PFET devices. The term "epitaxial" refers to crystal growth of layers having a well-defined structural orientation with respect to a seed layer. In some embodiments, epitaxial source/drain regions 170 made of silicon or SiGe can be grown from nanostructure layers 121 and/or 122 of superlattice 155 under sacrificial gate structure 107. Epitaxial source/drain regions 170 can have elongated hexagonal-shaped cross-sections as shown in FIG. 1B. In some embodiments, epitaxial source/drain regions 170 can be grown by a molecular beam epitaxy (MBE) process or any suitable epitaxial process. In some embodiments, epitaxial source/drain regions 170 can be in-situ doped during the epitaxial growth using p-type or n-type dopants. In some embodiments, p-type doping precursors, such as diborane, boron trifluoride, and/or other p-type doping precursors can be used to provide the p-type dopants during the epitaxial growth. In some embodiments, n-type doping precursors, such as phosphine ($PH_3$), arsine ($AsH_3$), and/or other n-type doping precursors can be used to provide then-type dopants during the epitaxial growth. In some embodiments, epitaxial source/drain regions 170 can be ex-situ doped using an ion implantation process.

Referring to FIG. 6, in operation 610, an inter-layer dielectric (ILD) 130 can be formed, as shown in FIG. 2, through which electrical contacts can be made to source, drain, and gate terminals of nanosheet FETs 118P and 118N. ILD 130 may include silicon dioxide or a low-k dielectric material such as, for example, a fluorosilicate glass, a carbon-doped silicon dioxide, a porous silicon dioxide, a porous carbon-doped silicon dioxide, a hydrogen silsesquioxane, a methylsilsesquioxane, a polyimide, a polynorbomene, a benzocyclobutene and/or a polytetrafluoroethylene. For forming ILD 130, a deposition process such as, for example, chemical vapor deposition, plasma-enhanced chemical vapor deposition and/or spin coating may be performed.

Referring to FIG. 6, in operation 612, sacrificial structure 107 can be removed and replaced with a gate-all-around structure, as shown in FIGS. 2 and 13B-13E. In operation 612, nanostructure layers 122 are selectively removed to form gate openings 109 in the channel region. Gate openings 109 are then filled with metal by depositing gate structure 108, to complete GAA channel region 157, as shown in FIG. 12D. Remaining nanostructure channel layers 121 of superlattice 155 form nanostructure channels 110 of nanosheet FETs 118P and 118N. Each of GAA channel regions 157 can include GAA structures 158 (two shown in FIG. 13C).

FIGS. 13A-13E are magnified views showing operations for forming gate structure 108 and GAA channel region 157, according to some embodiments. With reference to FIGS. 13D and 13E, GAA channel region 157 includes multiple GAA structures 158, which surround channels 110 to control current flow therein. Each GAA structure 158 can be viewed as a radial gate stack that includes, from the outermost layer to the innermost layer, a gate dielectric layer 161, a work function metal layer 162, and a gate electrode 163. Gate electrode 163 is operable to maintain a capacitive applied voltage across nanostructure channels 110. Gate dielectric layer 161 separates the metallic layers of GAA structure 158 from nanostructure channels 110. Inner spacers 164 electrically isolate GAA structure 158 from epitaxial source/drain region 170 and prevent current from leaking out of nanostructure channels 110.

FIG. 13A is a magnified cross-sectional view of superlattice 155 and sacrificial structure 107 shown in FIG. 7. When superlattice 155 is etched back, a portion of superlattice 155 remains in channel regions 157 of nanostructure FETs 118N and 118P, underneath sacrificial structure 107, with exposed sidewalls. Inner spacers 164 can then be formed adjacent to nanostructure layers 122 in the GAA channel region 157, for example, by removing sidewall portions of nanostructure layers 122, e.g., using an etchant that consumes SiGe selective to nanostructure channels 110, and then depositing an insulator, e.g., SiN, in the recessed areas, prior to forming epitaxial source/drain regions 170 at sidewalls of GAA channel regions 157.

FIG. 13B is a magnified cross-sectional view of GAA channel region 157 following formation of inner spacers 164 and epitaxial source/drain regions 170, which can be grown laterally outward, in the x-direction, from nanostructure layers 121.

FIG. 13C is a magnified cross-sectional view of GAA channel region 157, following extraction of nanostructure layers 122 and thus forming gate openings 109.

FIG. 13D is a magnified view of GAA channel region 157, following replacement of sacrificial structure 107 with gate structure 108. First, sacrificial structure 107 is removed, leaving sidewall spacers 128 in place. Then, gate structure 108 is grown in a multi-step process to form a metal gate stack in place of sacrificial structure 107. Simultaneously, the radial gate stack is formed to fill gate openings 109 from the outside in, starting with gate dielectric layer 161, and ending with gate electrode 163. Along with the radial gate stack formation, STI 103 separating SiGe and silicon portions of bi-layer 106 can be extended so as to separate NMOS and PMOS devices throughout channel regions 157.

Referring to FIG. 13E, gate dielectric layer 161 can have a thickness between about 1 nm and about 5 nm. Gate dielectric layer 161 can include a silicon oxide and may be formed by CVD, atomic layer deposition (ALD), physical vapor deposition (PVD), e-beam evaporation, or another suitable deposition process. In some embodiments, gate dielectric layer 161 includes a high-k material, where the term "high-k" refers to a high dielectric constant. In the field of semiconductor device structures and manufacturing processes, high-k refers to a dielectric constant that is greater than the dielectric constant of $SiO_2$ (e.g., greater than 3.9). In some embodiments, the dielectric layer can include a silicon oxide, silicon nitride, and/or silicon oxynitride material, or a high-k dielectric material, such as hafnium oxide ($HfO_2$). A high-k gate dielectric may be formed by ALD and/or other deposition methods. In some embodiments, the gate dielectric layer can include a single layer or multiple insulating material layers.

Gate work function metal layer 162 can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), cobalt (Co), metal nitrides, metal silicides, metal alloys, and/or combinations thereof. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 163 may further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, TiN, and the like. The gate metal fill layer can be formed by ALD, PVD, CVD, or other suitable deposition process. Other materials, dimensions, and formation methods for the gate dielectric layer 161, the gate work function metal layer 162, and the gate electrode 163 are within the scope and spirit of this disclosure.

Following formation of gate structures 108 and GAA structures 158 in GAA channel regions 157, the structures of nanosheet FETs 118P and 118N are substantially complete, as shown in the isometric view of FIG. 1B and the cross-sectional view of FIG. 2.

In some embodiments, a method includes: forming a trench in a silicon (Si) substrate; filling the trench with strained silicon germanium (SiGe) to form a Si/SiGe bi-layer; forming a viscous layer over the Si/SiGe bi-layer; inverting the substrate; bonding the viscous layer to a carrier wafer; and relaxing the strained SiGe so that the Si/SiGe bi-layer has a silicon portion and a strain-relaxed SiGe portion.

In some embodiments, a structure includes: a silicon substrate; an insulating layer in the silicon substrate; a bi-layer, above the insulating layer, the bi-layer comprising a silicon portion in direct contact with a strain-relaxed silicon germanium (SiGe) portion; a channel region of a first transistor on the silicon portion of the bi-layer; and a channel region of a second transistor on the strain-relaxed SiGe portion of the bi-layer.

In some embodiments, a method includes: forming a bi-layer on a substrate, the bi-layer having a silicon portion side-by-side with a strain-relaxed silicon germanium (SiGe) portion; forming a first nanostructure field effect transistor (FET) on the silicon portion of the bi-layer; and forming a second nanostructure FET on the strain-relaxed SiGe portion of the bi-layer, each of the first and second nanostructure FETs comprising alternating layers of different materials.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a trench in a silicon (Si) substrate;
    filling the trench with strained silicon germanium (SiGe) to form a Si/SiGe bi-layer;
    forming a viscous layer over the Si/SiGe bi-layer;
    inverting the silicon substrate;
    bonding the viscous layer to a carrier wafer; and
    relaxing the strained SiGe so that the Si/SiGe bi-layer has a silicon portion and a strain-relaxed SiGe portion.

2. The method of claim 1, further comprising forming a transistor on the Si/SiGe bi-layer, wherein the transistor is one or more of a nanosheet transistor, a nanowire transistor, a fin field effect transistor (FinFET), and a planar FET.

3. The method of claim 2, wherein forming the transistor comprises forming a superlattice on the Si/SiGe bi-layer having alternating layers of SiGe and silicon.

4. The method of claim 1, wherein filling the trench comprises growing an epitaxial SiGe film having a thickness in a range of about 20 nm to about 70 nm.

5. The method of claim 4, further comprising planarizing the epitaxial SiGe film.

6. The method of claim 1, wherein relaxing the strained SiGe comprises thinning inverting the silicon substrate.

7. The method of claim 6, wherein relaxing the strained SiGe further comprises forming an insulator between the silicon and strain-relaxed SiGe portions of the Si/SiGe bi-layer.

8. A method comprising:
    forming a trench in a first substrate;
    depositing a strained silicon germanium (SiGe) layer in the trench;
    forming a first oxide layer on the substrate and on the strained SiGe layer;
    forming a second oxide layer on a second substrate; and
    bonding the first oxide layer to the second oxide layer.

9. The method of claim 8, wherein depositing the strained SiGe layer in the trench comprises:
    forming the strained SiGe layer in the trench and on a top surface of the first substrate; and
    co-planarizing a top surface of the first substrate with a top surface of the SiGe layer.

10. The method of claim 8, wherein bonding the first oxide layer to the second oxide layer comprises inverting the first substrate over the second substrate.

11. The method of claim 8, further comprising:
    after bonding the first oxide layer to the second oxide layer, polishing a backside of the first substrate.

12. The method of claim 11, wherein polishing the backside of the first substrate comprises chemical mechanical polishing the backside of the first substrate to coplanarize the backside of the first substrate with the strained SiGe layer.

13. The method of claim 8, further comprising annealing the strained SiGe layer to form a relaxed SiGe layer.

14. The method of claim 8, further comprising forming a separation between the first substrate and the strained SiGe layer.

15. The method of claim 14, further comprising filling the separation with an insulating layer.

16. A method, comprising:
    forming a first insulating layer on a first substrate;
    forming, on a second substrate, a bi-layer comprising a silicon portion in direct contact with a silicon germanium (SiGe) portion;
    depositing a second insulating layer on the bi-layer;
    bonding a top surface of the first insulating layer to a top surface of the second insulating layer;
    forming a channel region of a first transistor on the silicon portion of the bi-layer; and
    forming a channel region of a second transistor on the SiGe portion of the bi-layer.

17. The method of claim 16, further comprising thinning the second substrate comprises chemical mechanical polishing a backside of the second substrate to coplanarize the silicon portion with the SiGe portion.

18. The method of claim 16, wherein bonding the top surface of the first insulating layer to the top surface of the second insulating layer comprises inverting the second substrate over the first substrate.

19. The method of claim 16, wherein forming the bi-layer comprises depositing a plurality of layers having different germanium concentrations.

20. The method of claim 16, wherein forming the channel region of the second transistor comprises forming a superlattice on the bi-layer having alternating layers of SiGe and silicon.

* * * * *